United States Patent
Li et al.

(10) Patent No.: US 9,558,909 B2
(45) Date of Patent: Jan. 31, 2017

(54) MULTIFUNCTIONAL ULTRAFAST ELECTRON GUN OF TRANSMISSION ELECTRON MICROSCOPE

(71) Applicant: INSTITUTE OF PHYSICS, CHINESE ACADEMY OF SCIENCES, Beijing (CN)

(72) Inventors: Jianqi Li, Beijing (CN); Huanfang Tian, Beijing (CN); Gaolong Cao, Beijing (CN); Chao Ma, Beijing (CN); Huaixin Yang, Beijing (CN)

(73) Assignee: INSTITUTE OF PHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/395,765

(22) PCT Filed: May 6, 2014

(86) PCT No.: PCT/CN2014/076846
§ 371 (c)(1),
(2) Date: Oct. 20, 2014

(87) PCT Pub. No.: WO2015/103829
PCT Pub. Date: Jul. 16, 2015

(65) Prior Publication Data
US 2016/0254117 A1    Sep. 1, 2016

(30) Foreign Application Priority Data
Jan. 7, 2014    (CN) .......................... 2014 1 0007910

(51) Int. Cl.
*H01J 37/26*    (2006.01)
*H01J 37/06*    (2006.01)
(Continued)

(52) U.S. Cl.
CPC .............. *H01J 37/06* (2013.01); *H01J 37/073* (2013.01); *H01J 37/26* (2013.01); *H01J 37/28* (2013.01); *H01J 2237/2802* (2013.01)

(58) Field of Classification Search
CPC ...................... H01J 37/06; H01J 37/075; H01J 37/26–37/2955
See application file for complete search history.

(56) References Cited

U.S. PATENT DOCUMENTS 4,096,386 A * 6/1978 Rempfer ............... H01J 37/285
                                                            250/311
4,801,801 A   1/1989 Mori et al.
(Continued)

FOREIGN PATENT DOCUMENTS

CN    102592929 A    7/2012
CN    102683146 A    9/2012

OTHER PUBLICATIONS

International Search Report, mailed Oct. 10, 2014, for PCT/CN2014/076846, 8 pages.

*Primary Examiner* — Mariceli Santiago
(74) *Attorney, Agent, or Firm* — Seed IP Law Group LLP

(57) ABSTRACT

The present invention discloses a multifunctional ultrafast electron gun of a transmission electron microscopy. The ultrafast electron gun of a transmission electron microscope comprises: a laser source, an electron gun body and a laser introducing module. The electron gun body comprises: an electron gun sleeve comprising a first section sleeve and a second section sleeve; and, a cathode, an acceleration electrode and an anode arranged in up-down order, wherein the cathode and the acceleration electrode are located within the first section sleeve and the anode is located within the second section sleeve. The laser introducing module includes an introducing module sleeve sealedly connected between the first section sleeve and the second section (Continued)

sleeve and provided with a laser incoming window in a side thereof; and a laser reflective mirror located in the introducing module sleeve, which is configured to face right the laser incoming window and configured adjacent to a central axis of the introducing module sleeve, and the reflective face of which is configured to make an angle of 45° with the central axis of the introducing module sleeve. The multifunctional ultrafast electron gun of a transmission electron microscopy according to the present invention achieve the best coherence performance of the electrons obtained in the case of the photoelectron emission compared with those in the prior art.

10 Claims, 2 Drawing Sheets

(51) Int. Cl.
　　*H01J 37/073*　　　(2006.01)
　　*H01J 37/28*　　　　(2006.01)

(56) References Cited

U.S. PATENT DOCUMENTS

| | | | | |
|---|---|---|---|---|
| 2004/0124365 A1* | 7/2004 | Steigerwald | .......... | H01J 37/073 250/423 P |
| 2011/0220792 A1* | 9/2011 | Zewail | .................. | H01J 37/244 250/307 |
| 2015/0123010 A1* | 5/2015 | Hirsch | .................. | H01J 37/073 250/424 |

* cited by examiner

MULTIFUNCTIONAL ULTRAFAST ELECTRON GUN OF TRANSMISSION ELECTRON MICROSCOPE

BACKGROUND OF THE INVENTION

Field of the Disclosure

The present invention relates to an electron microscope, and particularly to a multifunctional ultrafast electron gun of a transmission electron microscope.

Description of the Related Art

A transmission Electron Microscope (TEM) is designed to project accelerated and focused electron beam to a very thin sample such that electrons hit atoms in the sample and consequently moving direction of electrons is changed, thereby generating a three-dimensional scatter of electrons. A scattering angle of electrons is dependent upon density and thickness of the sample. Upon being scattered, an image with different shadings at different portions is Obtained. The resultant image is then displayed on an imaging device (such as, screen, photographic film or photo-coupler assembly) after being amplified and focused.

From the entire development process of a transmission electron microscope, discovery of electron and its wave-particle duality become a basis of a two-dimensional imaging of transmission electron microscopy. Use of spherical aberration corrector has remarkably improved spatial resolution of the transmission electron microscope, which currently reaches 1 Å or less, and even exceeds 0.5 Å. This resolution had met most of the requirements for analyzing structure of material, because, in most circumstances, the distance between neighboring atoms is more than 1 Å. Thus, researchers tend to enhance resolutions of a transmission electron microscope with respect to other dimensions. For example, energy resolution of electron energy loss spectroscopy has been raised up to 0.1 eV by using energy monochromator.

With development of material, chemistry and condensed matter physics, in study of the dynamic process of material, a strong desire had been raised on another dimension-time resolution for a transmission electron microscope, i.e., requiring to detect a transient state in a sufficient short time (for example, within several nanoseconds or even femtoseconds).

Compared with the conventional TEM, a time-resolved transmission electron microscope has advantages that a variety of experimental techniques can be integrated so as to study a dynamical behavior of matter with a high spatial resolution, energy resolution and time resolution. Observation on transient states and transient state behaviors (such as, chemical reactions, structural deformation or phase changes, etc.) is the key to understand many basic behaviors in chemistry, biology, physics and materials science. In chemistry field, key point is how to comprehend kinetics processes and reaction mechanism of a chemical reaction, such as, changes of different activity positions of catalyst, which is the central problem of femtosecond chemistry. In physics and materials science, the study of dynamical process of various phase transition behaviors, such as the structural phase transition, the metal-insulator transition and competition of various phases under external fields, forms a basis of understanding the mechanisms of various physical properties of material. In biology and medicine, studying structures of different biological molecules, such as cells, proteins, etc., facilitates understanding of the primary function of them in the living body, which can greatly promote development of modern medicine and biology.

Critical technology of time-resolved transmission electron microscopy is to create a non-continuous emission and ultrashort electron-pulse electron source. It is possible to achieve a high time-resolution by controlling the electron source by a femtosecond laser system so as to limit an electron pulse width to a femtosecond scale. There are two laboratories in the United States, where a nanosecond and femtosecond time-resolved transmission electron microscopy is achieved by reforming the optical system of TEM, both modifying the optical system of commercially available transmission electron microscope to achieve a TEM techniques with a time-resolved characteristics.

FIG. 1 is a schematic structural view of a time-resolved transmission electron microscope in prior art modified by B.W Reed Research Group. Referring to FIG. 1, the shown time-resolved transmission electron microscope is modified by adding a section of weak magnetic lens and an electron brass drift section over an illumination system, i.e., a condenser lens system, to a conventional transmission electron microscope. The electron brass drift section includes a laser incoming window for introducing laser light to be incident to the cathode and a laser reflective mirror for reflecting the incoming laser light to the cathode of the electron gun of the TEM to excite photoelectrons. The laser reflective mirror is treated to have an aperture for electron beam being passed therethrough, through which the electrons accelerated by the anode are passed to enter the condenser lens system of the TEM. The weak magnetic lens is provided to converge electrons with rather big scattering angles so as to obtain a bigger electron beam flow.

However, in the process of implementing the present invention, the applicant has found that, in the above-mentioned time-resolved transmission electron microscope, a near distance of 30 cm between the anode and the condenser lens system was added due to adding the electron brass drift section, which resulted the electrons exiting from the anode to pass through a long drift distance and became to travel in an increased divergence angle, and in turn the number of electrons entering the condenser lens system became less and dose of electrons turned lower. Even a weak magnetic lens was added to increase the number of electrons, the electron dose was less than that in conventional TEM. Furthermore, the electron coherence became poor due to the increased divergence angle of the collected electrons.

SUMMARY OF THE DISCLOSURE (i) Technical Problems to be Solved

In view of the above problems, the present invention provides a multifunctional ultrafast electron gun of a transmission electron microscope.

(ii) The Technical Solutions

According to one aspect of the present invention, there is provided a multifunctional ultrafast electron gun of a transmission electron microscope. The ultrafast electron gun of a transmission electron microscope comprises: a laser source, an electron gun body and a laser introducing module. The electron gun body comprises: an electron gun sleeve including a first section sleeve and a second section sleeve arranged in up-down order; and a cathode, an acceleration electrode and an anode located within the electron gun sleeve and arranged in up-down order along a central axis thereof, wherein the cathode and the acceleration electrode are located within the first section sleeve and the anode is located within the second section sleeve, A laser introducing module comprises an introducing module sleeve sealedly connected between the first section sleeve and the second section sleeve with its central axis coinciding with the central axis of the electron gun sleeve and provided with a laser incoming window in a side thereof; and a laser reflective mirror located in the introducing module sleeve, which is configured to face right the laser incoming window and to be located adjacent to the central axis of the introducing module sleeve, and a reflective face of which is configured to subtend an angle of 45' with relation to the central axis of the introducing module sleeve.

(iii) Beneficial Technical Effect

As can be seen from the above technical solution, the ultrafast electron gun of a transmission electron microscope according to the present invention has the following beneficial effects:

(1) As a separated electron gun reformed from an electron gun of a transmission electron microscopy, it may be adapted to any type of transmission electron microscope, (2) The multifunctional ultrafast electron gun of a transmission electron microscope according to the present invention achieves the best coherence performance of the electrons obtained in the case of the photoelectron emission compared with those in the prior art while maintaining similar luminance and coherence performance as a conventional thermal emission electron gun.

MAIN COMPONENTS

100—laser source;
200—electron gun body;
211, 212—electron gun sleeve;
220—cathode;
230—acceleration electrode;
240—anode;
300—laser introducing module;
310—introducing module sleeve;
320—laser incoming window;
330—laser reflective mirrors;
340—seal ring;
350—stage;
360—blind flange;
400—condenser lens system

DETAILED DESCRIPTION OF THE PREFERRED EMBODIMENT

In order to make a clearer understanding on objectives, technical solutions and advantages of the present invention, the present invention is further described in detail in combination with embodiments with reference to the accompanying drawings. It should be noted that, in the description of the specification or the drawings, similar or identical parts are denoted by the same reference numbers. Embodiments that are not shown or described herein are known by those skilled in the art. Furthermore, although examples of parameters including certain values are provided herein, it should be understood that these parameters are not needed to be exactly equal to the corresponding values, but may approximate the corresponding value within an acceptable error tolerance or design constraints. The orientation terms mentioned in the embodiment, such as, "upper", "lower", "front", "rear", "left", "right", etc. are only used with reference to directions in the accompanying drawing. Thus, the directions of these terms are used for description, and are not intended to limit the scope of the present invention.

The multifunctional ultrafast electron gun of a transmission electron microscope of the present invention can create high quality hot-electron or photoelectron emission, due to its unique design and precision machining technology, and may be used to study various processes of atoms within a picosecond, a femtosecond or a nanosecond in the kinetics process of various physical states.

Among above properties, the electron gun of a transmission electron microscope according to the present invention may not only generate hot-electron emission, but also produce photoelectron emission under light driving. The electron gun may be arbitrarily switched between the state of thermal electron emission and the state of photoelectron emission. The word of "ultrafast" refers to an ultra-short time scale, including attosecond, picosecond, femtosecond or nanosecond. Based on the present invention, it is possible to study dynamic change process of various physical states and structures in ultrashort time scale.

Figure 1:
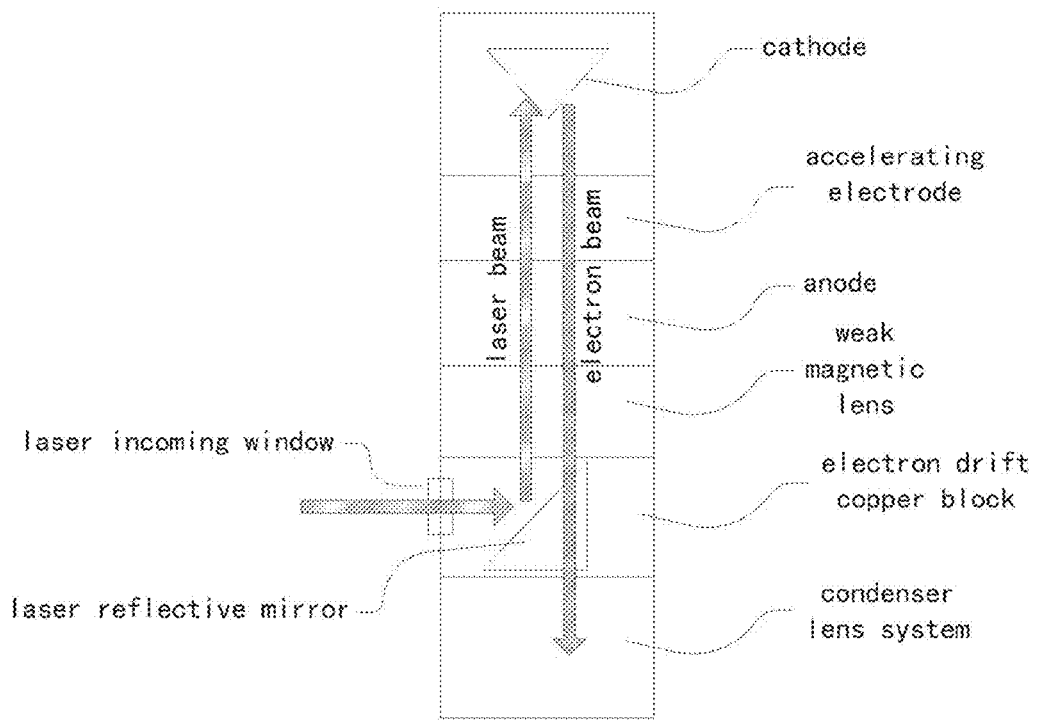
FIG. 1 is a schematic structural block diagram of a prior art time-resolved transmission electron microscope.
Figure 2:
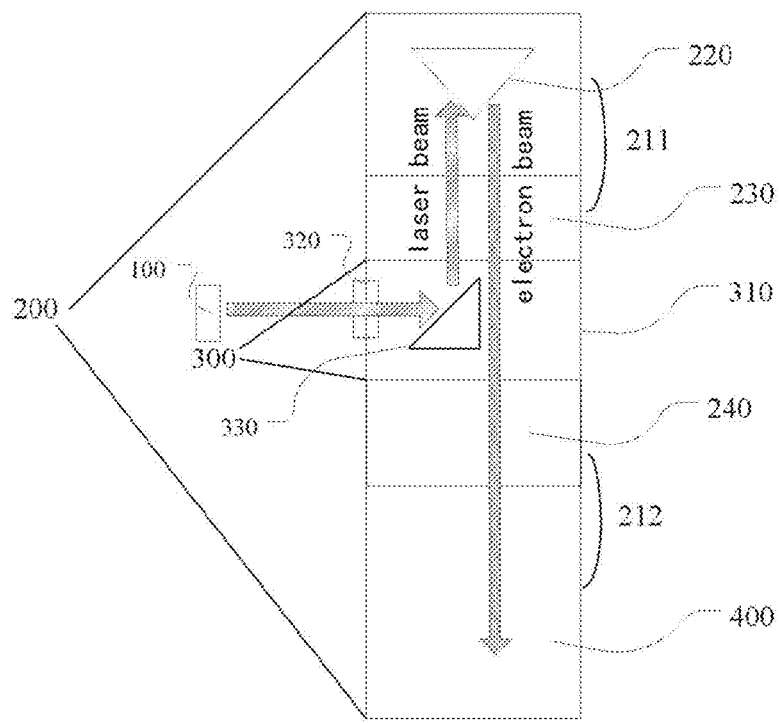
FIG. 2 is a schematic structural block diagram of an ultrafast electron gun of a transmission electron microscope according to an embodiment of the present invention.

In an exemplary embodiment of the present invention, there is provided a multifunctional ultrafast electron gun of a transmission electron microscope. FIG. 2 is a schematic structural block diagram of ultrafast electron gun of a transmission electron microscope according to an embodiment of the present invention. Referring to FIG. 2, the ultrafast electron gun of a transmission electron microscope comprises: a laser source 100, an electron gun body 200 and a laser introducing module 300. The electron gun body 200 includes an electron gun sleeve including a first section sleeve 211 and a second section sleeve 212 arranged in up-down order; and a cathode 220, an acceleration electrode 230 and an anode 240 located within the electron gun sleeve and arranged in up-down order along a central axis thereof, wherein the cathode 220 and the acceleration electrode 230 are located within the first section sleeve 211 and the anode 240 is located within the second section sleeve 212. A laser introducing module 300 comprises an introducing module sleeve 310 sealedly connected between the first section sleeve 211 and the second section sleeve 212 with its central axis coinciding with the central axis of the electron gun sleeve and provided with a laser incoming window 320 in a side thereof; and a laser reflective mirror 330 located in the introducing module sleeve 310, which is configured to face right the laser incoming window 320 and located adjacent to the central axis of the introducing module sleeve 310, and a reflective face of which is configured to subtend an angle of 45 with relation to the central axis of the introducing module sleeve 310.

In the embodiment, the laser light emitted by the laser source 100 is incident through the laser incoming window 330 on the laser reflective mirror 330 within the introducing module sleeve 310, and irradiated to the cathode 220 of the electron gun body 200 after being reflected by the laser reflective mirror 330, exciting electrons. The electrons excited from the cathode 220 of the electron gun are accelerated via the acceleration electrode 230 and passed through a section in the introducing module sleeve 310 that is not blocked by the laser reflective mirror 330, into a condenser lens system 400 of the ultrafast transmission electron microscope.

The various components of the ultrafast electron gun of a transmission electron microscope of the present embodiment will be described in detail hereafter.

In an embodiment, the laser source may be a titanium sapphire laser oscillator amplifier having a wavelength between 690 nm and 1040 nm, a mean power between 1 w and 5 w, a repetition frequency of 1 Hz-1 MHz, a maximum single pulse energy of 10 µJ-50 µJ@100 KHz, a pulse width between 50 fs and 500 fs, and a power stability <1% rms over 100 h. However, the present invention is not limited to this, and the laser source can also be other types of nanosecond or femtosecond laser.

In this embodiment, the electron gun body may be 2000EX transmission electron microscope of company JEOL, in which the cathode is $LaB_6$ (lanthanum hexaboride). However, the present invention is not limited to this. The cathode material of the electron gun body may also be made by $CeB_6$ (cerium hexaboride), Ta (tantalum), and other similar high quality cathode material. Further, according to the present invention, bias voltage of the cathode has an adjustment range from 0.5% to 1%, and preferably 0.7%, but may be other values.

The introducing module sleeve 310 has a diameter equal to that of the electron gun sleeve of the electron gun body 200, and has a height between 7 cm and 16 cm, preferably 12 cm. The present invention is not limited to this and other height value may be used.

Referring to FIG. 2, the introducing module sleeve 310 is provided with a laser incoming window 320 in a side thereof. The laser incoming window 320 is in shape of a circle with a diameter of 50 mm and is made of $CaF_2$ glass material with high transmittance. In other preferred embodiments of the present invention, the laser incoming window 320 may be configured to have a diameter from 30 mm to 100 mm and be made by other materials with a rather high transmittance (greater than 95% for example) at wavelength ranged from 210 nm to 250 nm.

Figure 3:
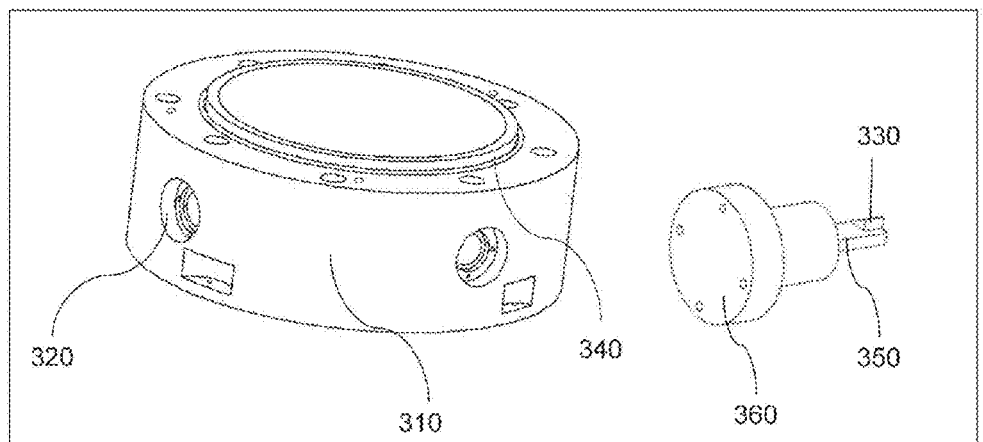
FIG. 3 is a schematic structural diagram of a laser introducing module of the ultrafast electron gun of a transmission electron microscope shown in FIG. 2.

FIG. 3 is a schematic structural diagram of a laser introducing module in the ultrafast electron gun of a transmission electron microscope shown in FIG. 2. Referring to FIG. 3, the introducing module sleeve 310 is fixed to the electron gun sleeve by hex-head screws. In order to ensure seal between the introducing module sleeve 310 and the electron gun sleeve, a seal ring 340 is provided between an upper section of the introducing module sleeve 310 and the first section sleeve 211 and between the lower section of the introducing module sleeve 310 and the second section sleeve 212, to maintain vacuum level of the inside of a transmission electron microscope.

In this embodiment, the laser reflective mirror is a right triangle mirror with a corner of 45°, of which a surface is plated with Mo, Al, or other material having high reflectance and conductivity. The right-angle side of the laser reflective mirror 330 is located as close as possible to the channel that the electron beam passes through, so as to ensure the angle of incidence of the ultrafast laser to the cathode of the electron gun as small as possible.

The laser reflective mirror 330 is fixed to the stage 350 by a stainless steel clip and the stage 350 is extended into the introducing module sleeve 310 by a blind flange 360.

It should be noted that the introducing module sleeve 310, the stage 350 and the blind flange 360 are all made of a nonmagnetic stainless steel material. However, the invention is not limited thereto. These components may be made by a tungsten bronze or non-magnetic and non-magnetizable material.

Figure 4A:
FIGS. 4A and 4B are respectively morphology images of a carbon nanotube obtained by using a conventional transmission electron and by using a transmission electron microscope with the electron gun shown in FIG. 2 in the case of the thermal electron emission.
Figure 4B:
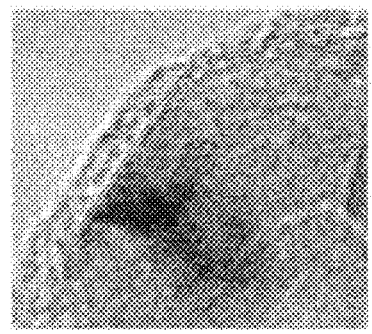

FIGS. 4A and 4B are respectively morphology images of a carbon nanotube obtained by using a conventional transmission electron microscope and by using a transmission electron microscope having the electron gun shown in FIG. 2 in the case of the thermal electron emission. It can be seen from FIGS. 4A and 4B that the thermal electron emission obtained by the present embodiment and that of the conventional transmission electron microscope achieve a same resolution.

Figure 5A:
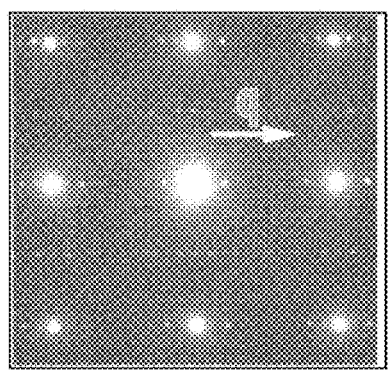
FIGS. 5A and 5B are respectively an electron diffraction pattern of BiSrCaCuO and the morphology image of gold standard sample Obtained by using a transmission electron microscope with the electron gun shown in FIG. 2 in the case of the photoelectron emission.
Figure 5B:
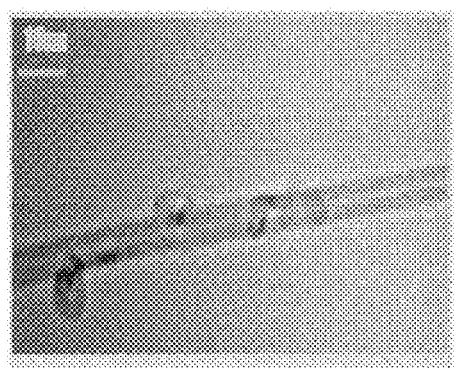

FIGS. 5A and 5B are respectively an electron diffraction pattern of BiSrCaCuO and the morphology image of a carbon nanotube obtained by using the multifunctional electron gun shown in FIG. 2 in the case of the photoelectron emission. It can be seen from FIGS. 5A and 5B photoelectrons obtained by the present embodiment exhibit good electron coherence and a resolution of the image obtained in the case of the photoelectron emission may be up to 0.5 nm.

It should be noted that the multifunctional ultrafast electron gun of the electron microscope of the present embodiment exhibits the best coherence performance of the electrons obtained in the case of the photoelectron emission compared with those in the prior art while ensuring similar brightness and coherence as a conventional thermal emission electron gun. However, it is not clear about the principles and techniques of the photoelectron emission and further exploration and discussion are still performed.

Herein, the embodiment of the invention has been described in detail in combination with the accompanying drawing. According to the above description, one skilled in the art may make a clear understanding on the ultrafast electron gun of a transmission electron microscope.

Further, the above definition of the components and methods are not limited to various specific structures, shapes or fashions mentioned in the above embodiment, and may be simply replaced or modified by those skilled in the art. For example, the laser reflective mirror also may be circle or oval; the laser reflective mirror may be fixed by way of piezoelectric driving, instead of a fixing means; the stage may be fixed by a bracket arranged in axial direction of the introducing module sleeve, substituting for the current partially suspending manner.

In summary, the present invention provides an electron gun of a transmission electron microscope for ultrafast electron diffraction and an ultrafast imaging, and thermal emission imaging as well, in which the design of the electron gun and the laser introducing module may vary with different microscope tube designs of transmission electron microscope manufacturers. Except to the geometry, an electron gun implementing the same principle of the present invention may be used in a transmission electron microscope available from different manufacturers. The ultrafast electron gun of a TEM may be used in fields of physics, chemistry, biomedicine and material science to study a dynamical change process of various behaviors within ultra-short time (nanoseconds, femtosecond, picosecond).

The specific embodiments described above are made to further describe the purpose, technical schemes and advantages of the present invention. It is understood that they are only specific embodiments of the invention, but are not intended to limit the invention. Any changes, equivalent replacement, modification within the spirit and principles of the invention should be fallen to the scope of the invention.

The invention claimed is:

1. A multifunctional ultrafast electron gun of a transmission electron microscope, characterized by comprising:
   a laser source (100);
   an electron gun body (200), comprising:
      an electron gun sleeve comprising: a first section sleeve (211) and a second section sleeve (212) arranged in up-down order; and
      a cathode (220), an acceleration electrode (230) and an anode (240) located within the electron gun sleeve and arranged in up-down order along a central axis thereof, wherein the cathode (220) and the acceleration electrode (230) are located within the first section sleeve (211) and the anode (240) is located within the second section sleeve (212);
   a laser introducing module (300) comprising:
      an introducing module sleeve (310) sealedly connected between the first section sleeve (211) and the second section sleeve (212) with its central axis coinciding with the central axis of the electron gun sleeve, and provided with a transparent laser incoming window (320) in a side thereof; and
      a laser reflective mirror (330) located in the introducing module sleeve (310), which is configured to face right the laser incoming window (320) and is located adjacent to the central axis of the introducing module sleeve (310), and a reflective face of which is configured to subtend an angle of 45° with relation to the central axis of the introducing module sleeve (310).

2. The multifunctional ultrafast electron gun of a transmission electron microscope according to claim 1, characterized in that, a laser light emitted by said laser source (100) is introduced onto the laser reflective mirror (330) within the introducing module sleeve (310) through the laser incoming window (330) and reflected by the laser reflective mirror (330) to be irradiated to the cathode (220) of the electron gun body (200);
   the electrons excited from said cathode (220) are accelerated via the acceleration electrode (230) and passed through a section in the introducing module sleeve (310) that is not blocked by the laser reflective mirror (330) into a condenser lens system (400) of the multifunctional ultrafast transmission electron microscope.

3. The multifunctional ultrafast electron gun of a transmission electron microscope according to claim 1, characterized in that,
   a distance from an inside edge of said laser reflective mirror (330) to the central axis of the introducing module sleeve (310) is between 0.2 mm and 1 cm.

4. The multifunctional ultrafast electron gun of a transmission electron microscope according to claim 3, characterized in that,
   the distance from the inside edge of said laser reflective mirror (330) to the central axis of the introducing module sleeve (310) is 1 mm.

5. The multifunctional ultrafast electron gun of a transmission electron microscope according to claim 1, characterized in that, said laser reflective mirror (330) is fixed to a stage (350) by a stainless steel clip or piezoelectric-drivingly mounted on the stage (350), wherein the stage (350) is fixed within the introducing module sleeve (310).

6. The multifunctional ultrafast electron gun of a transmission electron microscope according to claim 5, characterized in that, the stage extends within the introducing module sleeve (310) by a blind flange (360) or is fixed within the introducing module sleeve (310) by a bracket disposed along an axial direction of the introducing module sleeve.

7. The multifunctional ultrafast electron gun of a transmission electron microscope according to claim 1, characterized in that,
   the introducing module sleeve (310) is fixed to the electron gun sleeve by a screw; and
   seal rings (340) are respectively provided between an upper portion of the introducing module sleeve (310) and the first section sleeve (211) and between a lower portion of the introducing module sleeve (310) and the second section sleeve (212).

8. The multifunctional ultrafast electron gun of a transmission electron microscope according to claim 1, characterized in that,
   the introducing module sleeve (310) has a diameter equal to that of the electron gun sleeve and a height between 7 cm and 16 cm.

9. The multifunctional ultrafast electron gun of a transmission electron microscope according to claim 1, characterized in that,
   the laser incoming window (320) is a circular in shape with a diameter between 30 mm and 100 mm and is made of material with a laser transmittance larger than 95% at wavelength between 210 nm and 500 nm.

10. The multifunctional ultrafast electron gun of a transmission electron microscope according to claim 1, characterized in that,
   said laser source (100) is a picosecond, femtosecond or nanosecond laser and the laser reflective mirror (330) is circular or oval in shape.

* * * * *